United States Patent [19]

Oku

[11] Patent Number: 5,538,910
[45] Date of Patent: Jul. 23, 1996

[54] METHOD OF MAKING A NARROW GATE ELECTRODE FOR A FIELD EFFECT TRANSISTOR

[75] Inventor: Tomoki Oku, Itami, Japan

[73] Assignee: Mitsubishi Denki Kabushiki Kaisha, Tokyo, Japan

[21] Appl. No.: 377,617

[22] Filed: Jan. 25, 1995

Related U.S. Application Data

[60] Division of Ser. No. 141,878, Oct. 27, 1993, Pat. No. 5,399,896, which is a continuation-in-part of Ser. No. 28,115, Mar. 9, 1993, Pat. No. 5,304,511.

[30] Foreign Application Priority Data

Aug. 9, 1993 [JP] Japan .................. 5-197108

[51] Int. Cl.⁶ .................. H01L 21/265; H01L 21/44
[52] U.S. Cl. .................. 437/39; 437/177; 437/912
[58] Field of Search .................. 437/39, 40 SH, 437/41 SH, 175, 176, 177, 178, 179, 912

[56] References Cited

U.S. PATENT DOCUMENTS 4,997,788  3/1991  Martens et al. .................. 437/175
5,138,409  8/1992  Kawai .................. 257/332

FOREIGN PATENT DOCUMENTS

| 58-87871 | 5/1983 | Japan . |
| 1243476 | 9/1989 | Japan . |
| 3289142 | 12/1991 | Japan . |
| 3278543 | 12/1991 | Japan . |
| 6232167 | 8/1994 | Japan .................. 437/912 |

*Primary Examiner*—George Fourson
*Assistant Examiner*—Brian K. Dutton
*Attorney, Agent, or Firm*—Leydig, Voit & Mayer

[57] ABSTRACT

A method of producing a field effect transistor that includes forming a step in a compound semiconductor substrate, forming a first insulating side wall at the step, forming an etch blocking layer on the substrate, removing the first insulating side wall, and etching the substrate not protected by the etch blocking layer to produce a recess. Subsequently, a second insulating side wall is formed at the sides of the recess, a refractory metal and a low resistance metal are sequentially deposited and formed as a gate electrode, and finally, source and drain electrodes are formed.

15 Claims, 11 Drawing Sheets

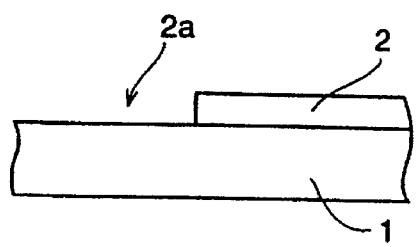
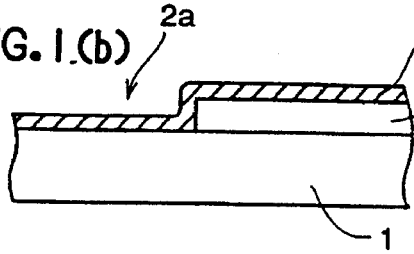
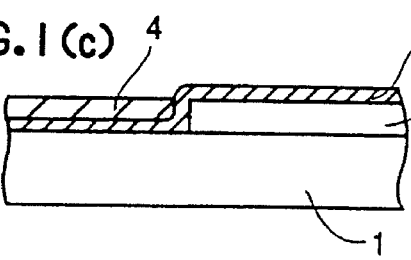
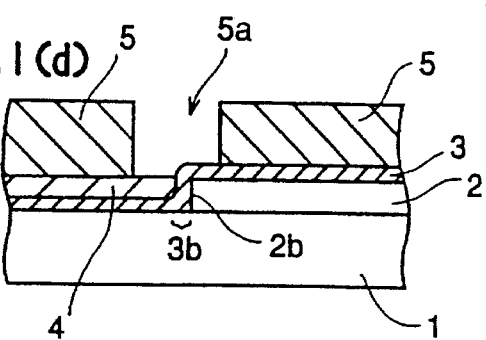
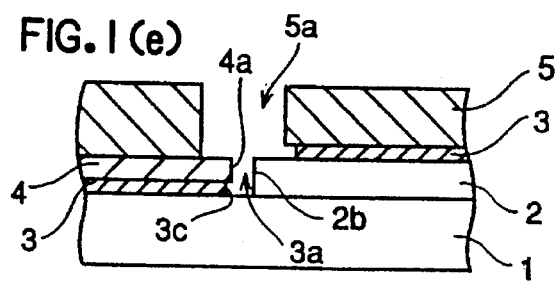
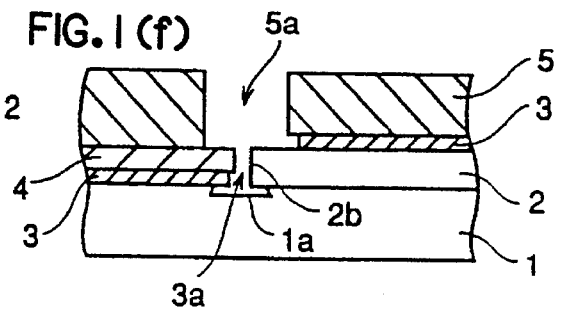
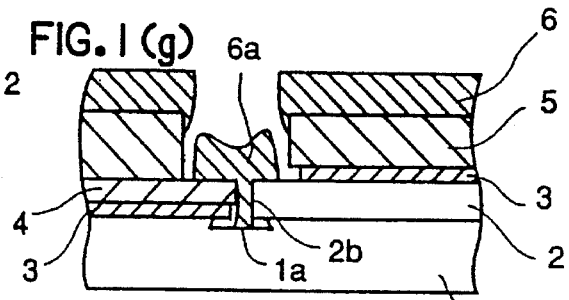
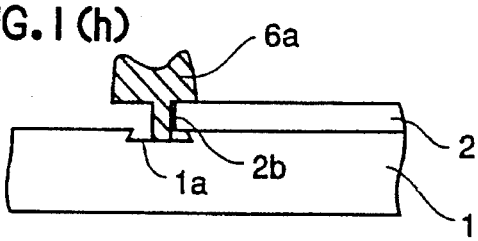

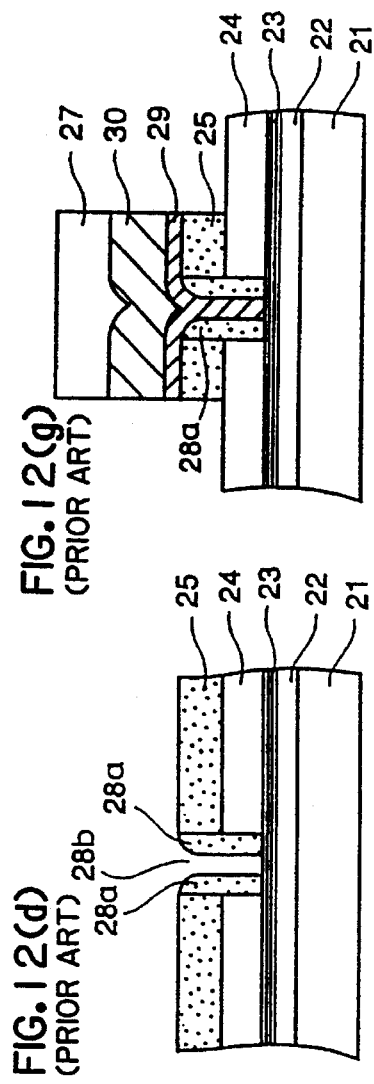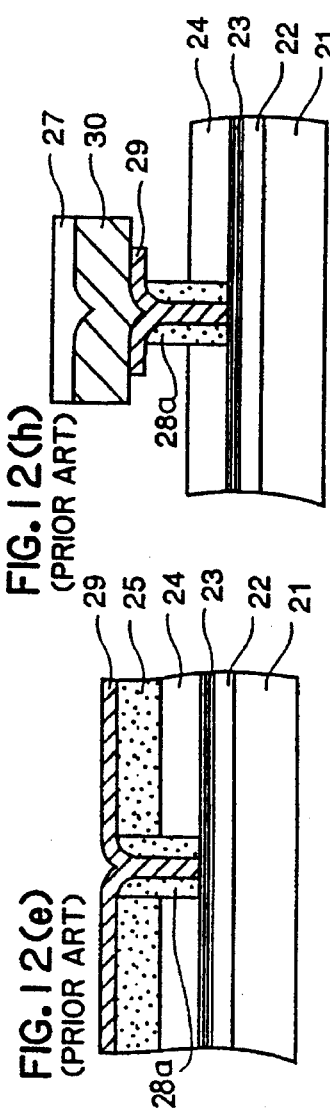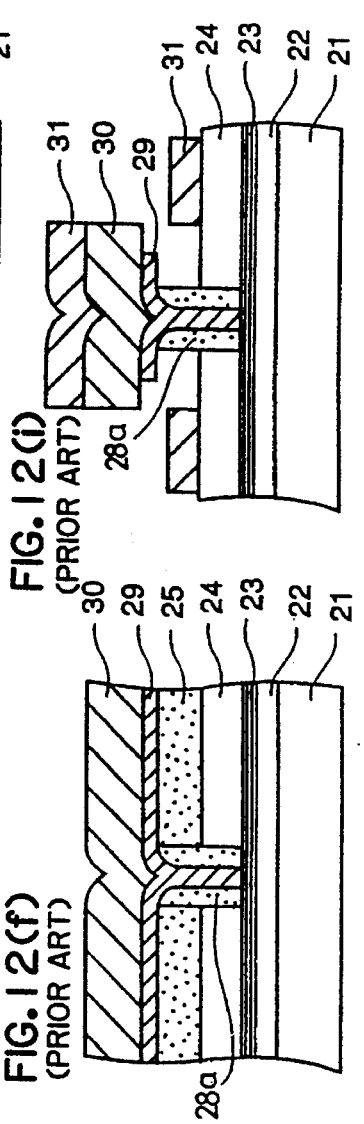

METHOD OF MAKING A NARROW GATE ELECTRODE FOR A FIELD EFFECT TRANSISTOR

This application is a division of application Ser. No. 08/141,878, filed Oct. 27, 1993, now U.S. Pat. No. 5,399,896, which, itself, is a continuation-in-part of application Ser. No. 08/028,115, filed Mar. 9, 1993, now U.S. Pat. No. 5,304,511.

FIELD OF THE INVENTION

The present invention relates to a semiconductor device and a method for producing the semiconductor device and, more particularly, to an improved process for producing a gate electrode.

BACKGROUND OF THE INVENTIONS

FIGS. 11(a) to 11(f) are sectional views illustrating process steps of producing a T-shaped gate electrode in a conventional production method of a compound semiconductor device. In the figures, reference numeral 1 designates a compound semiconductor substrate, numeral 1a designates a recess, numeral 2 designates an insulating film, numeral 6 designates a gate metal, numeral 6a designates a T-shaped gate electrode, numeral 7 designates a first photoresist film sensitive to electron beam exposure, numeral 8 designates a second photoresist film sensitive to light exposure, and numerals 7a and 8a designate apertures.

Initially, as illustrated in FIG. 11(a), a first photoresist film 7 sensitive to electron beam exposure and a second photoresist film 8 sensitive to light exposure are successively deposited on a compound semiconductor substrate 1. During the deposition, the first photoresist film 7 and the second photoresist film 8 must not mix with each other, more specifically, the resin contained in the first photoresist film 7 must not be dissolved by the solvent contained in the second photoresist film 8. Therefore, photoresists comprising resin and solvents satisfying the above-described condition are selected as the first and second photoresist films 7 and 8.

Then, a prescribed part of the second photoresist film 8 is irradiated with light from an optical exposure apparatus, followed by development of the film 8 using a prescribed developer, forming a first aperture 8a of a relatively large width in the second photoresist film 8 (FIG. 11(b)). Then, a prescribed part of the first photoresist film 7 is irradiated with an electron beam from an electron beam exposure apparatus through the first aperture 8a, followed by development of the film 7 using a prescribed developer, forming a second aperture 7a of a relatively small width (FIG. 11(c)).

Then, as illustrated in FIG. 11(d), using the first and second photoresist films 8 and 7 respectively having the first and second apertures 8a and 7b as a mask, a part of the compound semiconductor substrate 1 is etched away to form a recess 1a. Then, as illustrated in FIG. 11(e), a gate metal 6 is deposited over the entire surface, and the first and second photoresist films 7 and 8 and overlying portions of the gate metal 6 are removed using a lift-off technique, resulting in a T-shaped gate electrode 6a as shown in FIG. 11(f).

FIGS. 12(a)–12(i) illustrate process steps in a method for fabricating a HEMT (High Electron Mobility Transistor) disclosed in Japanese Published Patent Application No. 63-174374 an Electronics Letters 24(1988), p.1327. In the figures, reference numeral 21 designates a GaAs buffer layer, numeral 22 designates an intrinsic type (hereinafter referred to as i type) GaAs layer, numeral 23 designates an n type AlGaAs layer, numeral 24 designates an n$^+$ type GaAs layer, numerals 25 and 28 designate insulating films, numeral 26 designates a photoresist pattern, numeral 29 designates a refractory metal film, numeral 30 designates a low resistance metal film, and numeral 31 designates an ohmic metal film.

In a HEMT, a region in which electrons travel (an i type GaAs layer of a GaAs HEMT or an i type InGaAs layer of an InP HEMT) is spaced apart from a region which supplies electrons (an n type AlGaAs layer of the GaAs HEMT or a planar doped AlInAs layer of the InP HEMT) by the heterojunction to prevent the electrons from scattering by donor impurities, whereby the electron mobility is increased to insure a high-speed device. In order to increase high frequency characteristics of the HEMT, such as the cut-off frequency ($f_t$), the maximum oscillation frequency ($f_{max}$), and the unilateral gain (U), and to reduce the noise factor ($F_0$), it is necessary to reduce the gate length, the source resistance, and the gate resistance. In order to improve the reliability of the HEMT, the gate electrode usually comprises a refractory metal.

The production method illustrated in FIGS. 12(a)–12(i) is proposed to improve these characteristics of the HEMT.

Initially, as illustrated in FIG. 12(a), a GaAs buffer layer 21, an i type GaAs layer 22, an n type AlGaAs layer 23, and an n$^+$ type GaAs layer 24 are successively group on a semi-insulating GaAs substrate (not shown). Then, a first insulating film 25, such as SiO$_2$, is deposited on the n$^+$ type GaAs layer 24 to a thickness of about 3000 Å by plasma CVD, and a photoresist pattern 26 having an aperture of 0.5 μm width is formed on the insulating film 25.

In the step of FIG. 12(b), using the photoresist pattern 26 as a mask, a first aperture 25a is formed in the insulating film 25 by RIE (Reactive Ion Etching) using CHF$_3$ or CF$_4$. Thereafter, using the photoresist pattern 26 and the insulating film 25 as a mask, the n$^+$ type GaAs layer 24 is selectively etched by RIE using a mixture of SiCl$_4$ and SF$_6$ that does not etch the n type AlGaAs layer 23 to form a recess 24a. In FIG. 12(b), although opposite side surfaces of the n$^+$ type GaAs layers 24 exposed in the recess 24a are not etched beyond the aperture 25a, this etching (hereinafter referred to as side etching) is easily carried out by varying the bias voltage during the etching process.

After removing the photoresist pattern 26 using O$_2$ ashing or an organic solvent, a second insulating film 28, such as SiO$_2$, is deposited on the upper surface of the insulating film 25 and in the aperture 25a. Preferably, the insulating film 28 is deposited to a thickness of 3000–5000 Å by plasma CVD. Thereafter, the insulating film 28 is anisotropically etched by RIE perpendicular to the surface of the substrate, leaving portions 28a on the opposite side surfaces of the insulating film 25 and the GaAs layer 24 (FIG. 12(d)). Thus, a second aperture 28b about 0.25 μm wide is formed between the insulating films 28a.

In the step of FIG. 12(e), a refractory metal film 29 is sputter deposited over the surface to fill the aperture 28a, followed by annealing. Preferably, the refractory metal film 29 comprises WSi. Then, as illustrated in FIG. 12(f), a low resistance metal film 30 is sputter deposited over the refractory metal film 29. Preferably, the low resistance metal film 30 comprises Ti (500 Å)/Pt (1000 Å)/Au (3000 Å).

In the step of FIG. 12(g), a photoresist pattern 27 is formed on the low resistance metal film 30 and, using this photoresist pattern as a mask, the low resistance metal film 30 is patterned by ion milling and the refractor metal film 29 and the insulating film 25 are patterned by RIE, whereby a gate electrode is produced. During the etching process, the refractory metal film 29 and the insulating film 25 are excessively etched compared to the low resistance metal film 30. FIG. 12(h) illustrates a state where the RIE process is carried out until the insulating film 25 is completely removed.

After removing the photoresist pattern 27, a photoresist pattern for forming source and drain electrodes (not shown) is formed on the substrate, followed by deposition of an ohmic metal, such as AuGe/Ni/Au, and a lift-off process, producing ohmic metal films 31, i.e., spaced apart source and drain electrodes, on the $n^+$ type GaAs layer 24 (FIG. 12(i)). Thereafter, the substrate is annealed at 400° C. for about two minutes to complete the HEMT.

In the above-described production process, since the gate electrode and the source and drain electrodes are formed self-alignedly, it is possible to reduce the gate length ($L_g$) and the source resistance ($R_s$). In addition, since the gate electrode is formed in a T shape, the gate resistance ($R_g$) is also reduced. Further, since a refractory metal is used for the gate electrode, the reliability of the HEMT is significantly increased. Usually, the reliability is longer than $10^7$ hr in normal operation.

In the above-described prior art method of forming the T-shaped gate electrode illustrated in FIGS. 11(a)–11(f), the aperture pattern 7a for determining the width of the lower part of the T-shaped gate electrode, i.e., the gate length, is formed by electron beam exposure of the photoresist film 7 and development of the film. In this pattern exposure method employing electron beam irradiation, since the pattern drawing is carried out from wafer to wafer by irradiating each wafer with a electron beam, it is difficult to improve throughput.

In the prior art method, in order to produce the T-shaped gate electrode with high precision and stability, when the aperture pattern 8a which determines the width of the upper part of the T-shaped gate electrode is formed, i.e., when the photoresist film 8 sensitive to light exposure is developed using a prescribed developer, the photoresist film 7 sensitive to electron beam exposure lying under the photoresist film 8 must not be developed by the developer. Furthermore, when the photoresist film 8 is deposited on the photoresist film 7, these films must not mix with each other. Accordingly, the degree of freedom in selecting photoresist materials is significantly restricted.

Further, in the pattern exposure method using electron beam irradiation (direct drawing method), the resolution limit is 0.2 to 0.25 μm and the gate length cannot be reduced below that limit.

On the other hand, in the prior art production method of illustrated in FIGS. 12(a)–12(i), the first aperture 25a is formed in the insulating film 25, and the insulating side walls 28a are formed on the opposite side surfaces of the aperture 25a to form the second aperture 28b that is narrower than the first aperture 25a, and the gate metal is deposited in the second aperture 28b, whereby the gate length is reduced. Therefore, it is thought that the gate length can be shorter than 0.2~0.25 μm if the width of the first aperture 25a of the insulating film 25 is reduced to reduce the size of the second aperture 28b formed between the insulating side walls 28a in the first aperture 25a. However, the width of the first aperture 25a depends on the aperture width of the photoresist pattern 26 which varies in a range of 0.02~0.1 μm. This variation in the aperture width of the photoresist pattern 26 directly reflects on the width of the second aperture 28b that determines the gate length. Therefore, in the prior art method, although it is possible to make the gate length shorter than 0.1 μm, the gate length unfavorably varies from wafer to wafer, so that it is difficult to produce a gate electrode having a prescribed gate length below 0.1 μm with high reproducibility.

Further, since the source and drain electrodes are formed self-alignedly with the asymmetric T-shaped gate electrode, the gate-to-source distance is equal to the gate-to-drain distance. If the gate-to-drain distance is increased to attain a high drain breakdown voltage, the gate-to-source distance is also increased, adversely affecting fundamental characteristics of the transistor, such as mutual conductance.

SUMMARY OF THE INVENTION

It is an object of the present invention to provide a method for producing a semiconductor device in which a gate electrode having a prescribed gate length less than 0.2 μm is formed with high reproducibility without employing a photolithographic process including a pattern exposure step using electron beam irradiation.

It is another object of the present invention to provide a field effect semiconductor device that includes a gate electrode having a prescribed gate length less than 0.1 μm and that provides high mutual conductance.

It is still another object of the present invention to provide a method for producing the field effect semiconductor device with high reproducibility.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, in a method for producing a semiconductor device, a thin metal film is deposited over a semiconductor substrate having a step, a photoresist film is deposited over the thin metal film and patterned to form an aperture exposing a portion of the metal film on the side wall of the step of the semiconductor substrate, the exposed portion of the metal film is removed using the photoresist pattern as a mask, a gate metal is deposited over the entire surface of the semiconductor substrate, and the photoresist pattern and overlying portions of the gate metal are removed by a lift-off technique, resulting in a gate electrode. In this method, the gate length is determined by the thickness of the thin metal film deposited on the side wall of the step of the semiconductor substrate. Therefore, the gate length is easily and precisely controlled by the thickness of the thin metal film when it is deposited. More specifically, if the thickness of the metal film is less than 0.2 μm, a gate electrode having a gate length less than 0.2 μm is formed with high reproducibility. In addition, since the conventional pattern exposure process using electron beam irradiation is not needed, contrary to the prior art method, throughput in manufacturing semiconductor devices is improved. Further, since this method does not include depositing a photoresist film sensitive to light exposure on a photoresist film sensitive to electron beam exposure, the degree of freedom in selecting photoresist materials is increased.

According to a second aspect of the present invention, a semiconductor device includes a recess disposed between a source side high carrier concentration layer and a drain side high carrier concentration layer, and a gate electrode disposed in the recess. The space between a drain side overhanging portion of the gate electrode and the drain side high carrier concentration layer is larger than the space between a source side overhanging portion of the gate electrode and the source side high carrier concentration layer, and the gate length is less than 0.1 µm. Therefore, high frequency characteristics of the semiconductor device are improved. In addition, the gate-to-drain breakdown voltage is increased and the gate-to-drain capacitance is reduced with no reduction in the mutual conductance.

According to a third aspect of the present invention, in the above-described semiconductor device, the space between the gate electrode and the drain side high carrier concentration layer is larger than the space between the gate electrode and the source side high carrier concentration layer. Therefore, the gate-to-drain breakdown voltage is further increased and the gate-to-drain capacitance is further reduced.

According to a fourth aspect of the present invention, in a method for producing a semiconductor device, a compound semiconductor substrate having a step is prepared, a first insulating film of a prescribed width is formed on the side wall of the step, an etching block layer is formed at the surface of the compound semiconductor substrate using the first insulating film as a mask, the first insulating film is removed to expose a part of the compound semiconductor substrate, the exposed part of the substrate is etched using the etching block layer as a mask to form a recess whose width is based on the width of the first insulating film, a second insulating film is deposited over the entire surface of the substrate and etched leaving portions on opposite side surfaces of the recess to form an aperture whose width depends on the thicknesses of the remaining portions of the second insulating film, and a gate metal is deposited in the aperture. In this method, the gate length is determined by the width of the first insulating film deposited on the side wall of the step in the compound semiconductor substrate, and positions of the drain side and source side overhanging portions of the gate electrode are determined by the height of the step. Therefore, the gate length is set to a prescribed value less than 0.1 µm with high precision, and the position of the drain side overhanging portion of the gate electrode is higher than the source side overhanging portion.

According to a fifth aspect of the present invention, in the above-described production method, when the recess is formed by etching a part of the compound semiconductor substrate, the width of the recess is enlarged toward the drain side. Therefore, a semiconductor device in which the space between the gate electrode and the drain side high carrier concentration layer is larger than the space between the gate electrode and the source side high carrier concentration layer is easily achieved.

BRIEF DESCRIPTION OF THE DRAWINGS

FIGS. 1(a) to 1(h) are sectional views illustrating process steps for producing a T-shaped gate electrode of a compound semiconductor device in accordance with a first embodiment of the present invention.

FIGS. 12(a)–12(i) are sectional views illustrating process steps in a method for producing a HEMT in accordance with the prior art.

DETAILED DESCRIPTION OF THE PREFERRED EMBODIMENT

Figure 2:
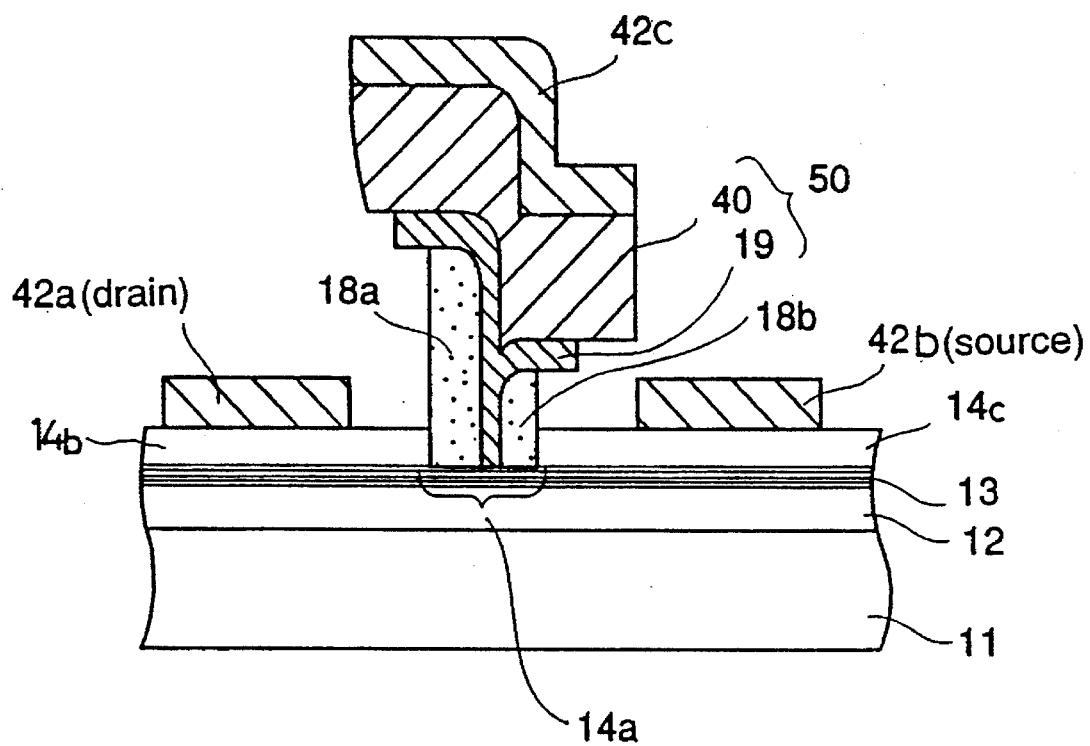
FIG. 2 is a sectional view illustrating a HEMT in accordance with a second embodiment of the present invention.

FIGS. 1(a)–1(h) are sectional views illustrating process steps in a method for producing a T-shaped gate electrode of a semiconductor device in accordance with a first embodiment of the present invention. In the figures, the same reference numerals as those in FIGS. 11(a) to 11(f) designate the same or corresponding parts. Reference numeral 2 designates an insulating film, numeral 2a designates an aperture, numeral 2b designates a side wall of the insulating film 2, numeral 3 designates a WSi (tungsten silicide) film, numeral 3a designates an aperture, numeral 3b designates a part of the WSi film 3 on the side wall 2b of the insulating film 2, numeral 3c designates a side wall of the WSi film 3, numeral 4 designates a photoresist film, numeral 4a designates a side wall of the photoresist film 4, numeral 5 designates a photoresist pattern, and numeral 5a designates an aperture.

Initially, as illustrated in FIG. 1(a), an insulating film 2 comprising, for example, $SiO_2$, is deposited on the surface of the compound semiconductor substrate 1 comprising GaAs or InP. Preferably, this insulating film 2 is deposited to a thickness of about 5000 Å using a plasma CVD method. Then, a prescribed portion of the insulating film 2 is etched away to form a first aperture 2a so that an end of the insulating film 2 is positioned in a region where a gate electrode is to be formed.

In the step of FIG. 1(b), a WSi film 3 is deposited over the entire surface of the compound semiconductor substrate 1 to a thickness a little under 0.2 µm by sputtering or CVD.

Then, a photoresist film is deposited over the entire surface of the substrate 1 so that the aperture 2a is completely filled with the film. Then, the photoresist film is etched by RIE using an $O_2$ plasma, leaving a portion of the photoresist film 4 in the aperture 2a (FIG. 1(c)).

Thereafter, a photoresist film 5 about 1 µm thick is deposited over the entire surface and patterned to form a second aperture 5a so that the center of the aperture 5a is positioned opposite the WSi film 3b on the side wall 2b of the insulating film 2 (FIG. 1(d)). The photoresist film is patterned using a conventional photolithographic technique including a pattern exposure process with an optical exposure apparatus. The aperture 5a prescribes the width of the upper part of the T-shaped gate electrode which is formed in later process.

In the step of FIG. 1(e), using the photoresist pattern 5 and the photoresist film 4 as a mask, the WSi film 3 (3b) is etched until the surface of the compound semiconductor substrate 1 is exposed using a plasma etching process with a gas mixture of $CF_4$ and $O_2$ to form a third aperture 3a between the side wall 2b of the insulating film 2 and the side walls 4a of the photoresist film 4. The third aperture 3a prescribes the width of the lower part of the T-shaped gate electrode, i.e., the gate length.

In the step of FIG. 1(f), using the photoresist film 4 and the insulating film 2 as a mask, a part of the compound semiconductor substrate 1 is etched to form a recess 1a.

In the step of FIG. 1(g), a gate metal 6 comprising Au/Ti is deposited over the entire surface of the substrate 1. Then, the photoresist pattern 5, portions of the gate metal 6 lying over the photoresist pattern 5, and the photoresist film 4 are removed using a lift-off technique, and the WSi film 3 is removed by RIE using a gas mixture of $CF_4$ and $O_2$ or a gas mixture of $CH_2F_2$ and $SF_6$, resulting in a T-shaped gate electrode 6a disposed in the recess 1a of the compound semiconductor substrate 1 (FIG. 1(h)). The gate electrode 6a has a gate length less than 0.2 µm.

In the above-described method of producing the T-shaped gate electrode according to the first embodiment, the width of the aperture 3a of the mask for the deposition of the gate metal, which width prescribes the gate length, is determined by the thickness of the WSi film 3b deposited on the side wall 2a of the insulating film 2. Therefore, the gate length can be reduced by simply controlling the thickness of the WSi film 3 when it is deposited over the compound semiconductor substrate 1. Since the deposition process can provide a WSi film of a thickness less than 0.2 µm, a gate length less than 0.2 µm can be achieved. Further, since this process does not require a pattern exposure process using electron beam irradiation, contrary to the prior art process, throughput is improved compared to the prior art process. Further, the photoresist pattern 5 is formed by a conventional photolithographic technique including a pattern exposure process using an optical exposure apparatus and the photoresist film 4 is only a mask for etching the WSi film 3. Therefore, even if the photoresist film 4 and the photoresist pattern 5 comprise materials that mix, these photoresist films do not adversely affect controllability in producing the electrode. As a result, the degree of freedom in selecting photoresist materials is significantly increased.

While in the above-described first embodiment the metal film 3 comprises WSi, other refractory metals may be employed with the same effects as described above.

FIG. 2 is a sectional view illustrating a HEMT in accordance with a second embodiment of the present invention. In the figure, reference numeral 11 designates a GaAs buffer layer disposed on a semi-insulating GaAs substrate (not shown). An i type GaAs layer 12 is disposed on the buffer layer 11. An n⁻ type AlGaAs layer 13 is disposed on the i type GaAs layer 12. An n⁺ type GaAs layer 14 is disposed on the n⁻ type AlGaAs layer 13. A recess 14a penetrates through the n⁺ type GaAs layer 14. A gate electrode 50 is disposed on a part of the n⁻ AlGaAs layer 13 in the recess 14a. The gate electrode 50 comprises a refractory metal film 19 contacting the surface of the AlGaAs layer 13 and a low resistance metal film 40 disposed on the refractory metal film 19. Preferably, the refractory metal film 19 comprises WSi and the low resistance metal film 40 comprises Au. Insulating films 18a and 18b comprising $SiO_2$ are disposed on parts of the n⁻ type AlGaAs layer 13 in the recess 14a where the WSi film 19 is absent. Spaced apart source and drain electrodes 42b and 42a comprising an ohmic metal are disposed on the n⁺ type GaAs layer 14.

The width of the refractory metal film 19 contacting the surface of the n⁻ AlGaAs layer 13, i.e., the gate length, is below 0.1 µm, whereby high frequency characteristics of the HEMT are improved. The gate electrode 50 has an asymmetric shape with the drain side overhanging portion positioned higher than the source side overhanging portion. The insulating films 18a and 18b separate the gate electrode 50 from the high carrier concentration n⁺ GaAs layer 14 beneath the drain and source electrodes 42a and 42b, respectively. The width of the insulating film 18b between the gate and the drain is larger than the width of the insulating film 18a between the gate and the source, i.e., the gate-to-drain distance is larger than the gate-to-source distance, whereby the gate-to-drain break down voltage is increased and the gate-to-drain capacitance is reduced, resulting in increased gain.

An ohmic metal film 42c on the low resistance metal film 40 is formed simultaneously with the source and drain electrodes 42b and 42a. This ohmic metal film 42c may be removed.

In the HEMT according to the second embodiment of the present invention like the prior art HEMT of FIG. 12(i), the gate electrode 50 comprises the lower part of the refractory metal film 19 and the upper part of the low resistance metal film 40, whereby the life time of the HEMT in its operating state is increased and the high frequency characteristics are improved. In addition, since the gate length is reduced to less than 0.1 µm and the gate-to-drain distance is larger than the gate-to-source distance, the high frequency characteristics are further improved and the gain is further increased.

FIGS. 3(a)–3(i) and 4(a)–4(h) are sectional views illustrating process steps in a method for fabricating the HEMT of FIG. 2. In the figures, the same reference numerals as in FIG. 2 designate the same or corresponding parts. Reference numeral 15 designates a photoresist pattern, numerals 16 and 16a designate insulating films, and numeral 17 designates an AlGaAs layer.

Figure 3:
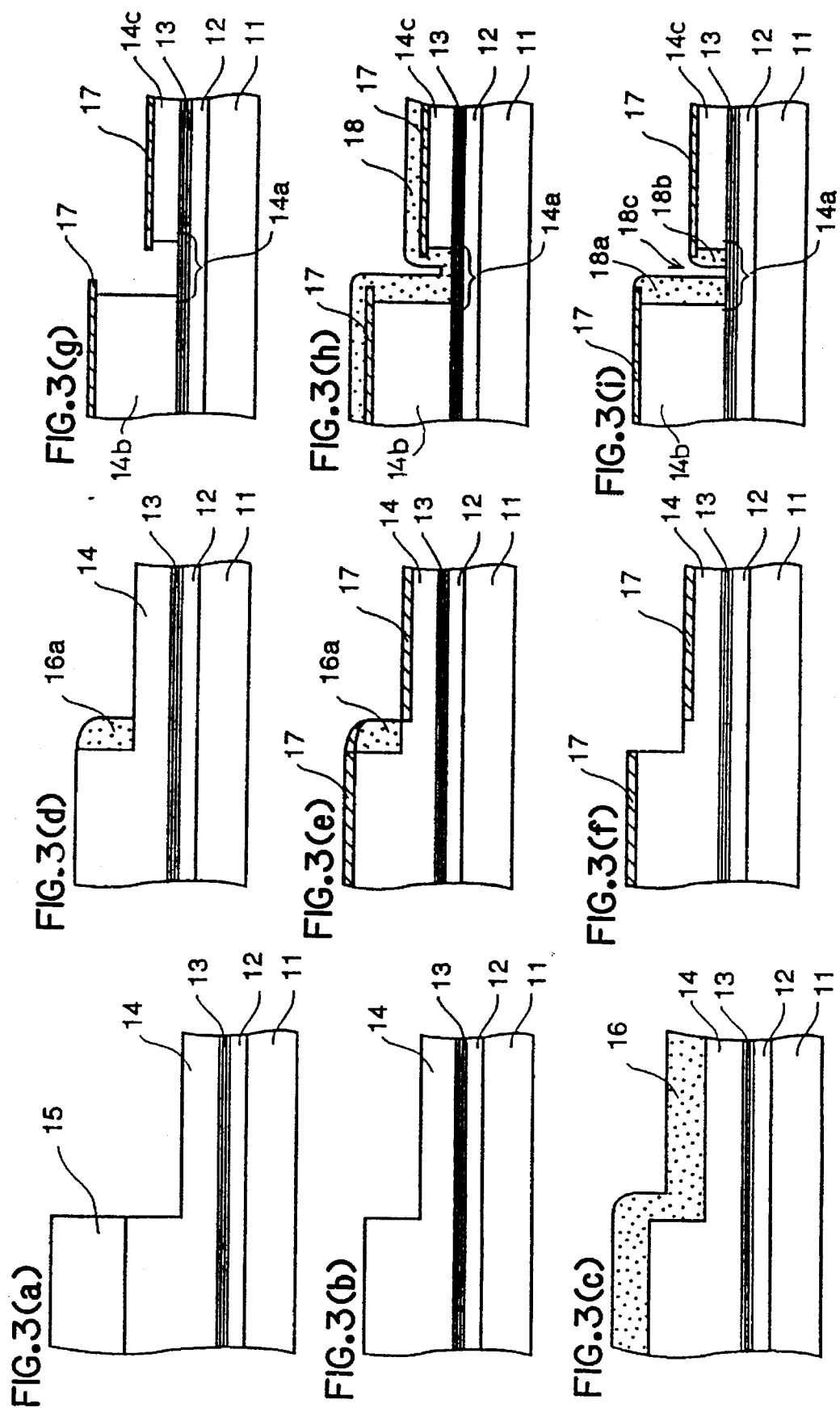
FIGS. 3(a)–3(i) and 4(a)–4(h) are sectional views illustrating process steps in a method for producing the HEMT of FIG. 2.

Initially, as illustrated in FIG. 3(a), a GaAs buffer layer 11, an i type GaAs layer 12, an n⁻ type AlGaAs layer 13, and an n⁺ type GaAs layer 14 are successively deposited on a semi-insulating GaAs substrate (not shown). Then, a photoresist pattern 15 is formed on a prescribed part of the n⁺ GaAs layer 14, and the n⁺ type GaAs layer 14 is etched using the photoresist pattern 15 as a mask, forming a step in the n⁺ GaAs layer 14. The height of this step is 2000–3000 Å. Since it is to be desired that this step be perpendicular to the surface of the substrate, the n⁺ type GaAs layer 14 is etched by anisotropic etching, such as RIE using $Cl_2$ gas.

After removing the photoresist pattern 15 using $O_2$ ashing or an organic solvent (FIG. 3(b)), an insulating film 16 comprising $SiO_2$ is deposited over the n⁺ type GaAs layer 14 covering the step. Preferably, the insulating film 16 is deposited to a thickness of about 2000 Å by plasma CVD (FIG. 3(c)).

In the step of FIG. 3(d), the entire surface of the insulating film 16 is subjected to RIE using a gas mixture of $CHF_3$ and $O_2$ or a gas mixture of $CF_4$ and $O_2$, leaving a portion 16a on the side wall of the step of the n⁺ type GaAs layer 14. The width of the insulating film 16a remaining on the side wall is about 0.2 µm.

Then, Al ions are implanted into the n$^+$ type GaAs layer 14 and the insulating film 16a to a concentration of $10^{22}$ ions/cm$^3$ to a depth of about 100 Å. The depth of about 100 Å is achieved by an implantation energy of 20 keV, and the concentration of $10^{22}$ ions/cm$^3$ is achieved by an implantation current of 100 Å and the implantation time of 100 seconds. FIG. 3(e) illustrates the structure after the ion implantation. In FIG. 3(e), reference numeral 17 designates an Al implanted region of the GaAs layer 14, i.e., an AlGaAs layer.

After removing the insulating film 16a with hydrofluoric acid (FIG. 3(f)), a portion of the n$^+$ type GaAs layer 14 is etched away, using the AlGaAs layer 17 as a mask and the n$^-$ type AlGaAs layer 13 as an etch stop layer, by RIE using a gas mixture of SiCl$_4$ and SF$_6$ or ECR (Electron Cyclotron Resonance) etching, whereby a recess 14a and spaced apart n$^+$ type GaAs layers 14b and 14c are formed (FIG. 3(g)). During this etching process, the n$^+$ type GaAs layer 14 is selectively etched while the AlGaAs layers 17 and 13 are not etched. In addition, the side etching of the n$^+$ type GaAs layer 14 beneath the AlGaAs layer 17 is controlled by varying the bias voltage during the etching process. More specifically, if the bias voltage is large, the etching is carried out perpendicular to the mask (AlGaAs layer 17) with no pattern shift. If the bias voltage is small, side surfaces of the GaAs layer 14 beneath the mask 17 are excessively etched. Since it is to be desired that the gas discharge and the bias voltage be separately controlled, ECR etching is preferable to RIE. FIG. 3(g) illustrates the state where the side surfaces of the GaAs layer 14 beneath the AlGaAs layer 17 are excessively etched. In FIG. 3(g), the side-etched portion of the thick GaAs layer 14b is larger than the side-etched portion of the thin GaAs layer 14c because the etching rate increases with an increase in the width of the surface subjected to the etching (hereinafter referred to as aperture width). In this case, the aperture width is equal to the thickness of the n$^+$ type GaAs layer 14b (14c).

Figure 5:
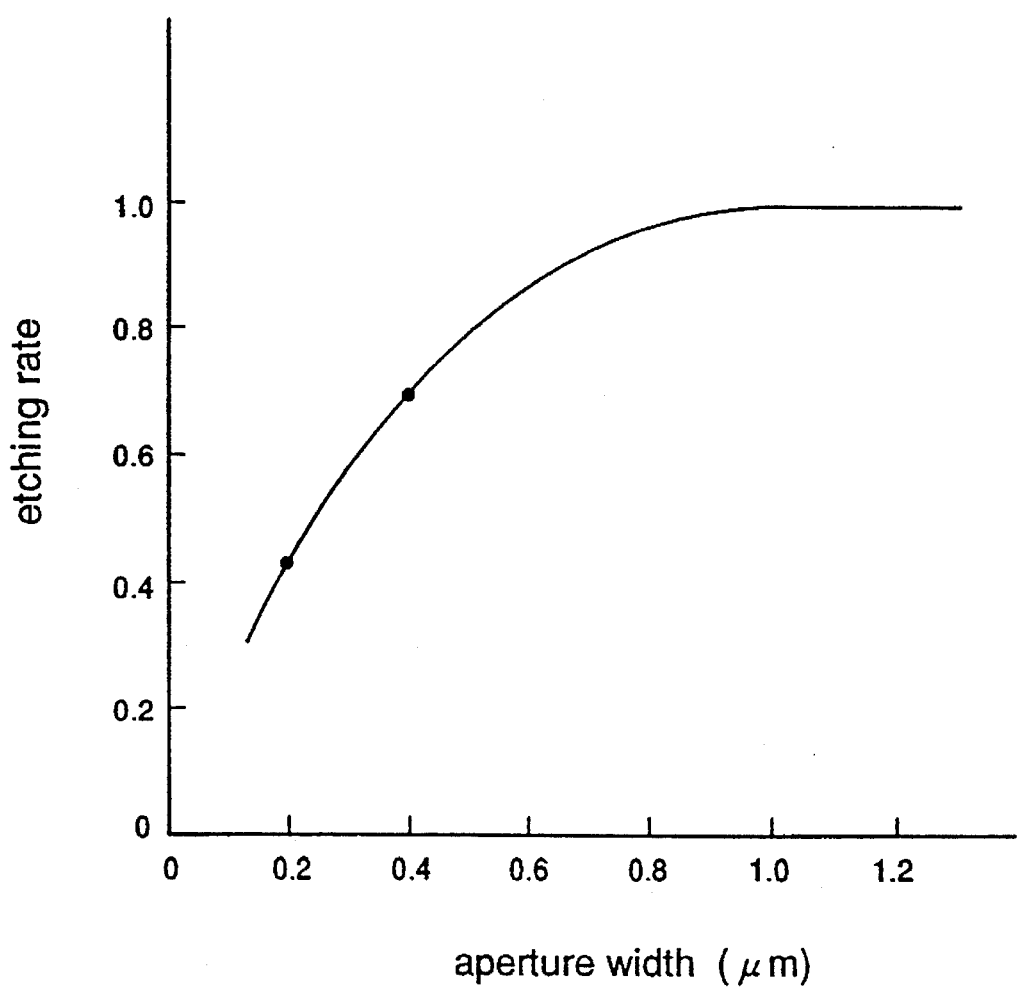
FIG. 5 is a graph illustrating etching rate vs. aperture width characteristics of an n+ type GaAs layer.

This will be explained in more detail using FIG. 5. In FIG. 5, the abscissa shows the aperture width and the ordinate shows the etching rate. In FIG. 3(g), the thickness, i.e., the aperture width, of the GaAs layer 14b is 0.4 μm and the thickness, i.e., the aperture width, of the GaAs layer 14c is 0.2 μm. In FIG. 5, the etching rate at the aperture width of 0.4 μm is about 0.7 and the etching at the aperture width of 0.2 μm rate is about 0.4. Therefore, when the 0.2 μm thick GaAs layer 14c is side-etched by 0.1 μm, the 0.4 μm thick GaAs layer 14b is side-etched-by 0.18 m.

As described above, if the bias voltage is increased, the n$^+$ type GaAs layer 14 is etched with no side etching. Even in this case, the GaAs layer 14 is selectively etched without etching the n$^-$ type AlGaAs layer 13, and the ratio of the selective etching of the GaAs layer 14 to the AlGaAs layer 13 is higher than 30, i.e., 30 (GaAs):1 (AlGaAs).

In the step of FIG. 3(h), an insulating film 18 comprising SiO$_2$ is deposited on the AlGaAs layer 17 and in the recess 14a, preferably by plasma CVD. Then, as illustrated in FIG. 3(i), the insulating film 18 is etched by RIE using a gas mixture of CHF$_3$ and O$_2$ or a gas mixture of CF$_4$ and O$_2$, leaving portions 18a and 18b on the side surfaces of the n$^+$ type GaAs layers 14b and 14c. In the recess 14a, an aperture 18c narrower than 0.1 μm is formed between the insulating films 18a and 18b.

Figure 4:
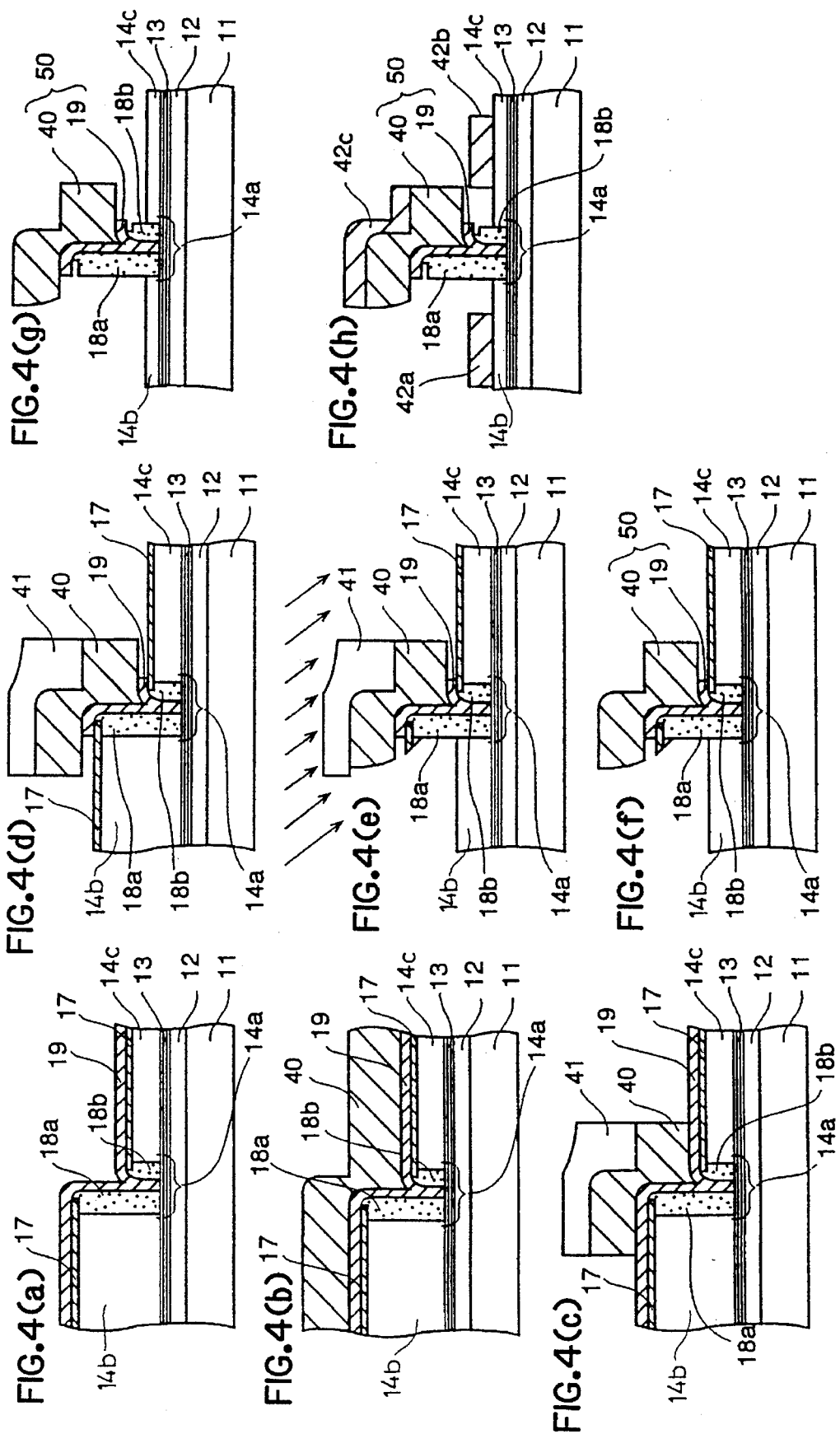

In the step of FIG. 4(a), a refractory metal film 19 comprising WSi is deposited over the entire surface so that the aperture 18c is filled with the metal film. Preferably, the refractory metal film 19 is deposited by blanket CVD or collimated sputtering. Then, the substrate is annealed at 400°~500° C. to recover from damage in the n$^-$ type AlGaAs layer 13 and the i type GaAs layer 12 caused by the CVD or sputtering process.

A low resistance metal film 40 comprising Au is deposited on the refractory metal film 19 by sputtering (FIG. 4(b)) and, thereafter, a photoresist pattern 41 is formed on a prescribed part of the low resistance metal film 40. Using the photoresist pattern 41 as a mask, the low resistance metal film 40 is etched by ion milling. Assuming that the etching rate of the refractory metal film 19 by the ion milling is 1, the etching rate of the low resistance metal film 40 by the ion milling is about 5. Therefore, only the low resistance metal film 40 is selectively etched.

Then, portions of the refractory metal film 19 are etched using a gas mixture of CF$_4$ and O$_2$ or a SF$_6$ gas (FIG. 4(d)), and the thick n$^+$ type GaAs layer 14b and the overlying AlGaAs layer 17 are etched by oblique ion milling until the GaAs layer 14b is reduced to a prescribed thickness (FIG. 4(e)).

After removing the photoresist pattern 41 using O$_2$ ashing or an organic solvent (FIG. 4(f)), the AlGaAs layer 17 is etched away with tartaric acid, and the n$^+$ type GaAs layers 14b and 14c are etched by RIE using a gas mixture of SiCl$_4$ and SF$_6$ or ECR etching, leaving portions of the layers 14b and 14c 500–1000 Å thick on the n$^-$ type AlGaAs layer 13 (FIG. 4(g)).

After forming a photoresist pattern (not shown), an ohmic metal film comprising AuGe/Ni/Au is deposited using the gate electrode 50 and the photoresist pattern as a mask, and the photoresist pattern and overlying portions of the ohmic metal film are removed by a lift-off technique, resulting in spaced apart source and drain electrodes 42a and 42b (FIG. 4(h)). The ohmic metal film 42c is also deposited on the gate electrode 50.

Hereinafter, advantages of the production process according to the second embodiment of the present invention over the prior art method will be described.

First of all, a description is given of the reason why the method according to the second embodiment can ensure a gate length below 0.1 μm.

In the prior art method of FIGS. 12(a)–12(i), the photoresist film 26 for forming the recess 25a is patterned using a photolithographic technique including an optical exposure process or an electron beam exposure process. During the photolithographic process, the width of the aperture formed in the photoresist film 26 varies from a design value in a range of ±0.02 μm. That is, the width of the recess 25a unfavorably varies from a design value in a range of ±0.02 μm. Therefore, in the step of FIG. 12(d), although the insulating films 28a are formed with the intention of forming the aperture 28b of 0.1 μm wide to achieve a gate length of 0.1 μm, the actual aperture width ranges from 0.08 μm to 0.12 μm.

On the other hand, according to the second embodiment of the present invention, the width of the recess 14a depends on the width of the insulating film 16a deposited on the side wall of the step in the n$^+$ GaAs layer 14 (FIG. 3(d)) and, therefore, the dimensional precision is very high. It is known in advance that the width of the insulating film 16a is about 70% of the thickness of the insulating film 16 deposited on the n$^+$ type GaAs layer 14 in the step of FIG. 3(c), so that variation in the thickness of the insulating film 16 is reflected in the width of the insulating film 16a. Since the variation in the thickness of the insulating film 16 is about 3%, if a target width of the insulating film 16a is 0.2 μm, the variation in the width is in a range of ±0.006 μm. Since the width of the insulating film 16a is reflected on the gate length, the variation in the gate length is also in the range of ±0.006 μm. However, when a gate electrode having a gate length of about 0.3 μm is fabricated using the method of this second embodiment, the width of the insulating film 16a should be 0.5 μm and then the variation in the gate length is 0.015 μm. In this case, the dimensional precision of the gate length is poorer than that of the prior art method.

According to the second embodiment of the present invention, when a gate length less than 0.1 μm is desired, the variation in the gate length is reduced to about ⅓ of that of the prior art method. As the result, a gate electrode having a prescribed gate length less than 0.1 μm is fabricated with high reproducibility.

A description is given of superior operating characteristics of the HEMT according to the second embodiment of the present invention.

Figure 6:
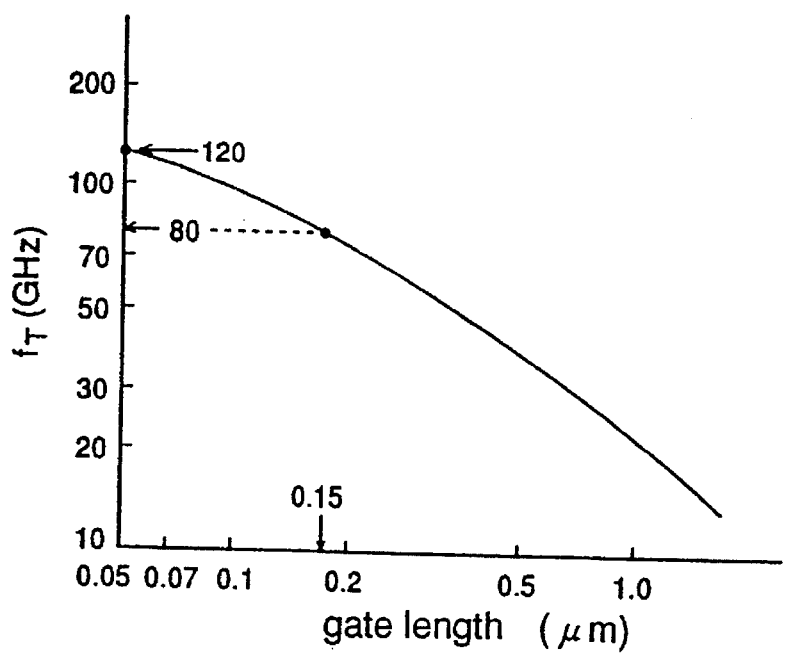
FIG. 6 is a graph illustrating cut-off frequency ($f_T$) vs. gate length ($L_g$) characteristics of HEMT.
Figure 7:
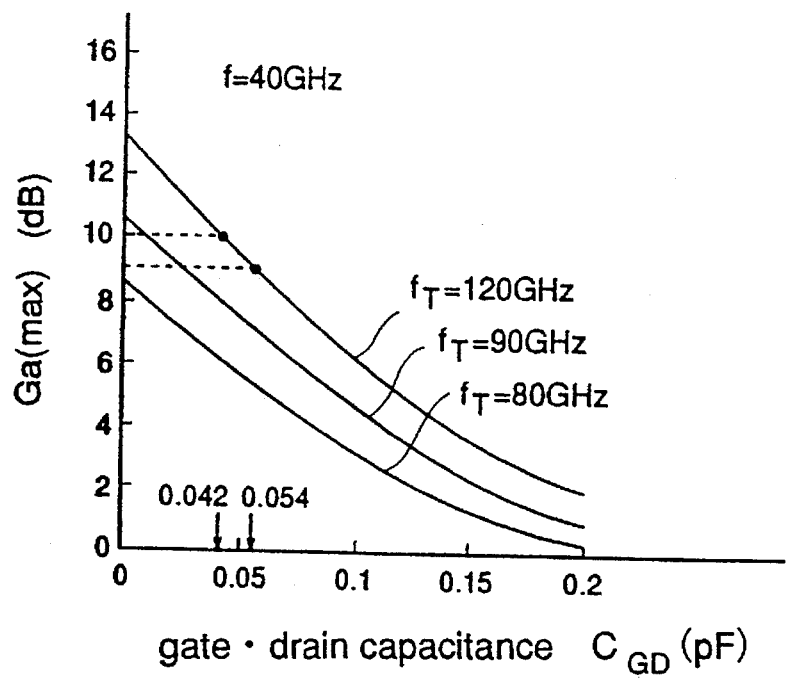
FIG. 7 is a graph illustrating gate-to-drain capacitance ($C_{GD}$) dependence of the maximum available power gain of an HEMT.

FIG. 6 is a graph illustrating gate length ($L_g$) dependence of cut-off frequency ($f_T$), and FIG. 7 is a graph illustrating the gate-to-drain capacitance ($C_{GD}$) dependence on maximum available power gain. As shown in FIG. 6, when the gate length is reduced from 0.15 μm to 0.05 μm, the cut-off frequency $f_T$ increases from 80 GHz to 120 GHz. In this state, if the gate-to-drain capacitance $C_{GD}$ is reduced from 0.054 pf to 0.042 pf, the maximum available power gain $Ga_{max}$ increases from 9.0 dB to 10.0 dB at the cut-off frequency $f_T$ of 120 GHz during the operation at the frequency of 40 GHz.

Figure 8A:
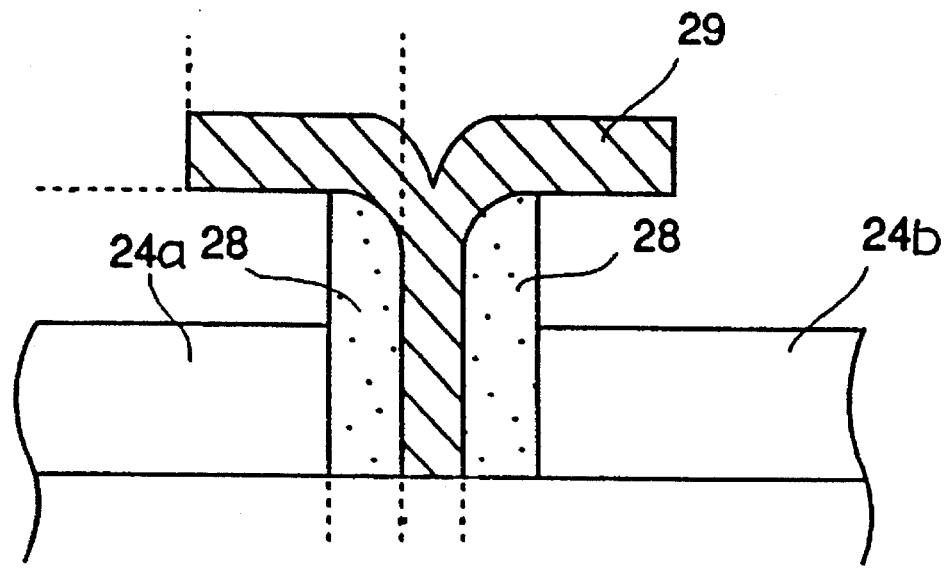
FIGS. 8(a) and 8(b) are enlarged views of the gate electrodes of a prior art HEMT and the HEMT of FIG. 2, respectively.
Figure 8B:
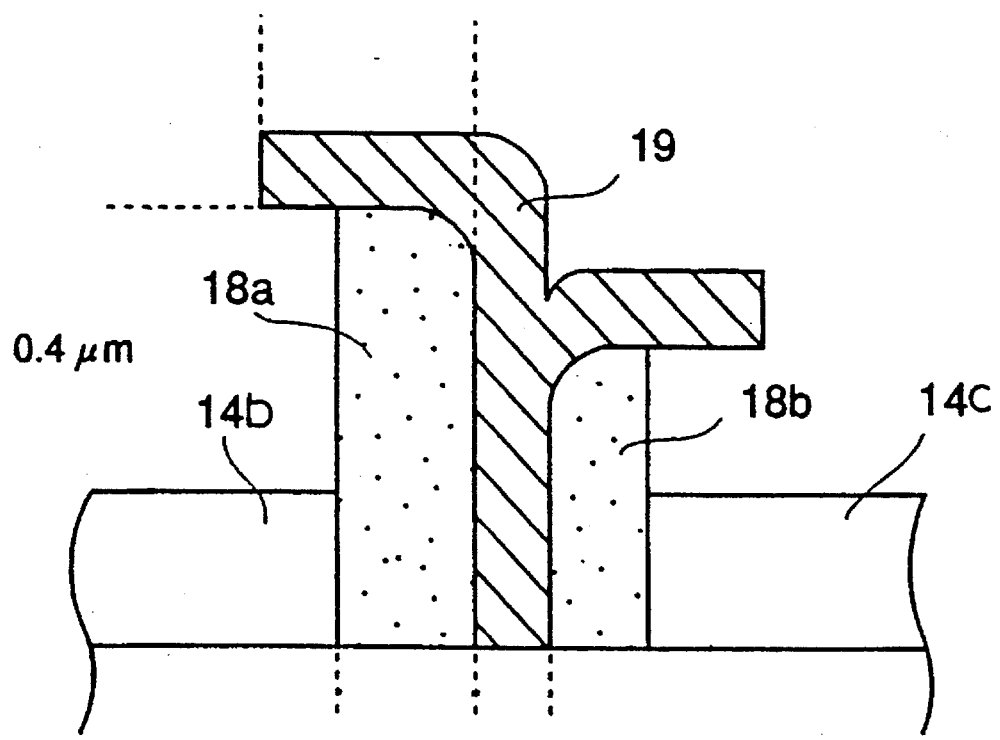

A description is given of the reason why the gate-to-drain capacitance $C_{GD}$ of the HEMT according to the second embodiment can be reduced by 0.012 pf compared to that of the prior art HEMT. FIG. 8(a) illustrates a gate electrode having a gate length of 0.1 μm fabricated by the prior art method (FIGS. 12(a)–12(i)). In FIG. 8(a), the space between the gate electrode 29 and the n⁺ type GaAs layer 24 beneath the drain electrode (not shown) is 0.1 μm, the space between the n⁺ type GaAs layer 24a and the overhanging portion of the gate electrode 29 is 0.2 μm, and the width of the overhanging portion of the gate electrode 29 is 0.3 μm. FIG. 8(b) illustrates a gate electrode fabricated by the method according to the second embodiment of the present invention. In FIG. 8(b), the space between the gate electrode 19 and the n⁺ type GaAs layer 14b beneath the drain electrode (not shown) is 0.2 μm, the space between the n⁺ type GaAs layer 14b and the overhanging portion of the gate electrode 19 is 0.4 μm, and the width of the overhanging portion of the gate electrode 19 is 0.3 μm. Assuming that the gate electrode 19 (29) and the n⁺ type GaAs layers 14b and 14c (24a and 24b) constitute a plane parallel capacitor, the gate width in the longitudinal direction of the gate electrode is 280 μm, and the dielectric constant of the SiO₂ film 18 is 4.0, the capacitances of the overhanging portions of the gate electrodes according to the prior art and the present invention are represented as follows.

[Prior Art]

$$C = \epsilon_r \epsilon_s \frac{S}{d} = 4 \times 8.85418 \times 10^{-14} \times$$
$$\frac{280 \times 10^{-14} \times 0.2 \times 10^{-4}}{0.1 \times 10^{-4}} + 8.85418 \times 10^{-14} \times$$
$$\frac{280 \times 10^{-4} \times 0.3 \times 10^{-4}}{0.2 \times 10^{-4}}$$
$$= 0.024 \text{ pF}$$

[Present Invention]

$$C = \epsilon_r \epsilon_s \frac{S}{d} = 4 \times 8.85418 \times 10^{-14} \times$$
$$\frac{280 \times 10^{-14} \times 0.2 \times 10^{-4}}{0.2 \times 10^{-4}} + 8.85418 \times 10^{-14} \times$$
$$\frac{280 \times 10^{-4} \times 0.3 \times 10^{-4}}{0.4 \times 10^{-4}}$$
$$= 0.012 \text{ pF}$$

Since about 0.03 pF of the gate-to-drain capacitance $C_{GD}$ does not depend on the capacitance of the overhanging portion of the gate electrode, the gate-to-drain capacitance $C_{GD}$ of the HEMT of the present invention is 0.042 pF (=0.012 pF+0.03 pF), which is lower than the gate-to-drain capacitance of 0.054 pF (=0.024 pF+0.03 pF) of the prior art HEMT.

As described above, in the production method of the HEMT according to the second embodiment of the present invention, the gate electrode having a prescribed gate length less than 0.1 μm is formed with high precision and stability. In addition, the space between the overhanging portion of the gate electrode 19 and the drain side n⁺ type GaAs layer 14b is increased, and the space between the gate electrode 19 and the drain side n⁺ type GaAs layer 14b, i.e., the width of the drain side insulating film 18a, is larger than the space between the gate electrode 19 and the source side n⁺ type GaAs layer 14c, i.e., the width of the source side insulating film 18b. As a result, high-performance HEMTs with improved high frequency characteristics, reduced gate-to-drain capacitance, and increased gain are fabricated with high reproducibility at good yield.

In the above-described second embodiment, when the n⁺ type GaAs layer 14 is etched to form the recess 14a (FIG. 3(g)), the etching is carried out under a condition that encourages side etching, i.e., at a low bias voltage. If the etching is carried out at a high bias voltage to prevent side etching, the insulating films 18a and 18b in the recess 14a have the same width. Even in this case, since the gate electrode with the drain side overhanging portion higher than the source side overhanging portion is attained, the gate-to-drain capacitance $C_{GD}$ can be reduced.

FIGS. 9(a)–9(d) are sectional views illustrating a method for fabricating a HEMT in accordance with a third embodiment of the present invention. In the figures, the same reference numerals as in FIGS. 3(a)–3(i) and 4(a)–4(h) designate the same or corresponding parts. Reference numeral 43 designates an AlGaAs layer, numeral 44 designates a GaAs layer, numerals 45 and 46 designate photoresist patterns.

Initially, a GaAs buffer layer 11, an i type GaAs layer 12, an n⁻ type AlGaAs layer 13, and an n⁺ type GaAs layer 14 are successively grown on a semi-insulating GaAs substrate (not shown) to form a compound semiconductor substrate. Then, an AlGaAs layer 43 and a GaAs layer 44 are formed on the n⁺ type GaAs layer 14, and a photoresist pattern 45 is formed on a prescribed part of the GaAs layer 44. Using the photoresist pattern 45 as a mask, the GaAs layer 44 is etched by RIE with a gas mixture of SiCl₄ and SF₆ (FIG. 9(a)), and the AlGaAs layer 43 is etched by wet etching with tartaric acid or RIE with Cl gas (FIG. 9(b)). The thickness of the GaAs layer 44 is 2000~3000 Å. Since the GaAs layer 44 and the AlGaAs layer 43 are etched away during the production process, these layers need not have electrically good crystallinities. The AlGaAs layer 43 is about 200 Å thick and is hardly side etched even in the wet etching process.

After removing the photoresist pattern 45, the same process steps as those described with respect to FIG. 3(c)–3(i) and 4(a)–(d) are carried out. Thereafter, a photoresist pattern 46 is formed on the source side AlGaAs layer 17 (FIG. 9(c)). Using the photoresist patter 46 as a mask, the drain side AlGaAs layer 17 is etched away with tartaric acid and the n$^+$ type GaAs layer 44 is selectively etched away by RIE with a gas mixture of SiCl$_4$ and SF$_6$ which does not etch the AlGaAs layer 43 (FIG. 9(d)). After removing the photoresist patterns 41 and 46 with O$_2$ ashing or an organic solvent and the AlGaAs layers 17 and 43 with tartaric acid, a photoresist pattern (not shown) is formed, and an ohmic metal film comprising AuGe/Ni/Au is deposited using the gate electrode 50 and the photoresist pattern as a mask. Then, the photoresist pattern and overlying portions of the ohmic metal film are removed by a lift-off technique, resulting in a source electrode 42b and a drain electrode 42a as shown in FIG. 4(h). Thus, the HEMT is completed.

Figure 9A:
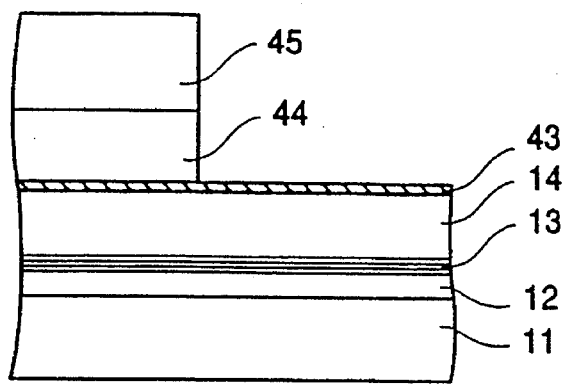
FIGS. 9(a)–9(d) are sectional views illustrating process steps in a method for producing a HEMT in accordance with a third embodiment of the present invention.
Figure 9B:
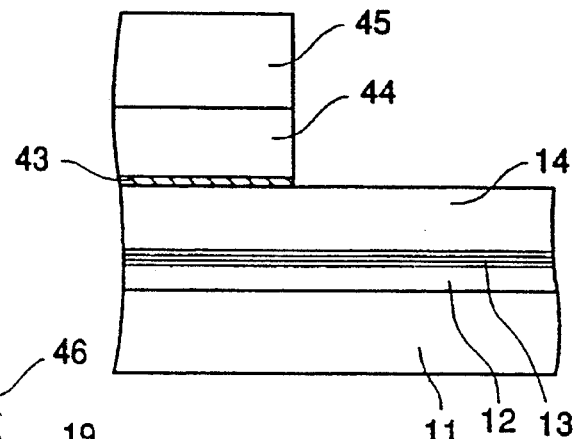
Figure 9C:
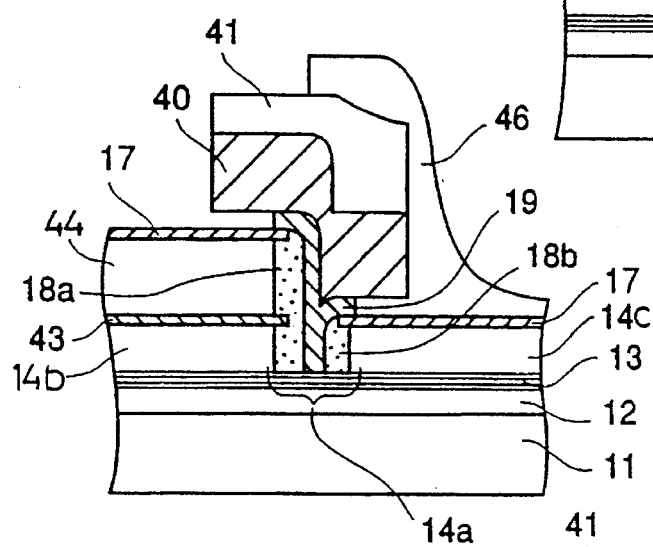

According to the third embodiment of the present invention, the height of the step formed on the compound semiconductor substrate depends on the thickness of the GaAs layer 44, and the thicknesses of the n$^+$ GaAs layers 14b and 14c of the completed HEMT are the same as the thickness of the GaAs layer 14 when it is deposited in the step of FIG. 9(a). Therefore, in this production method, HEMTs with the same dimensions are fabricated with high reproducibility, further improving the production yield compared to the method according to the second embodiment.

Figure 9D:
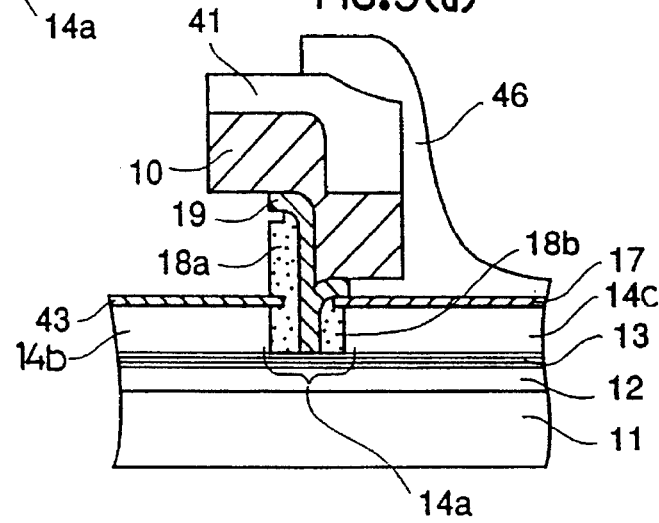

While in the above-described third embodiment the drain side AlGaAs layer 17 and the GaAs layer 44 are etched away using the photoresist pattern 46 as a mask as illustrated in FIG. 9(d), these layers may be removed by the oblique ion milling employed in the second embodiment, as illustrated in FIG. 4(e).

Figure 10:
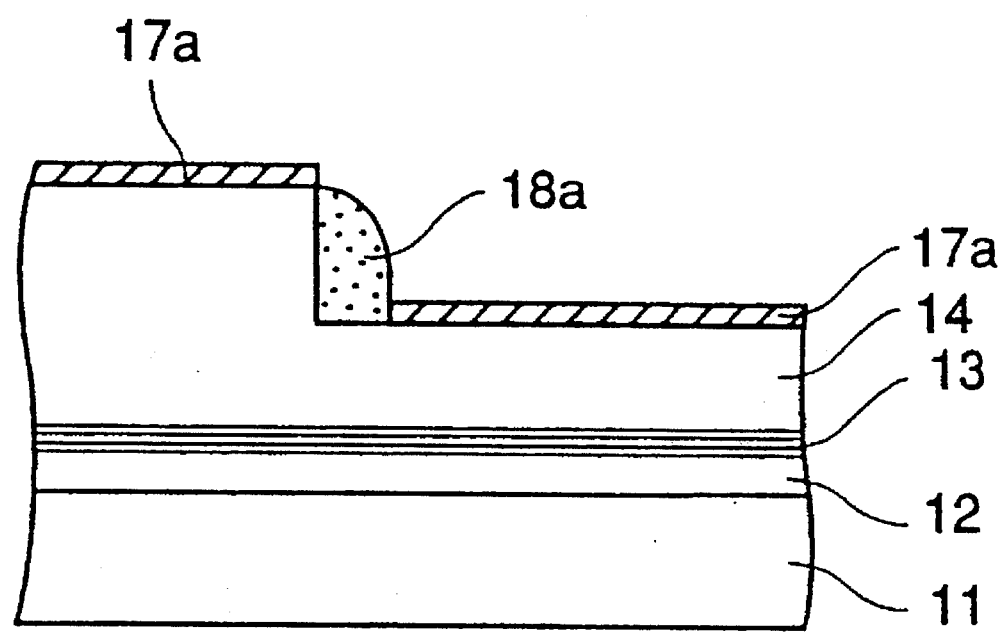
FIG. 10 is a sectional view illustrating a main step in a method for producing a HEMT in accordance with a fourth embodiment of the present invention.
Figure 11A:
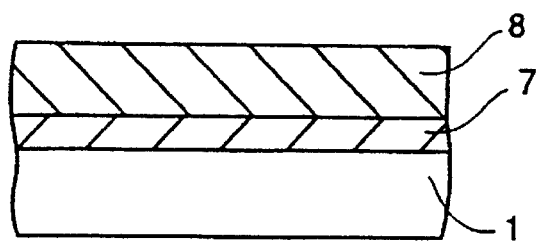
FIGS. 11(a)–11(f) are sectional views illustrating process steps for producing a T-shaped gate electrode of a compound semiconductor device in accordance with the prior art.
Figure 11B:
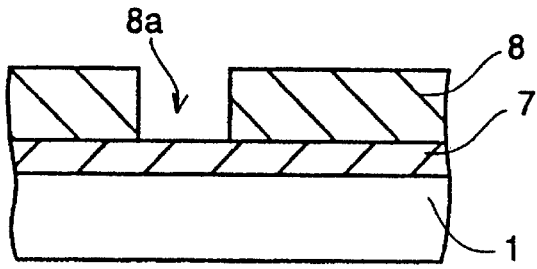
Figure 11C:
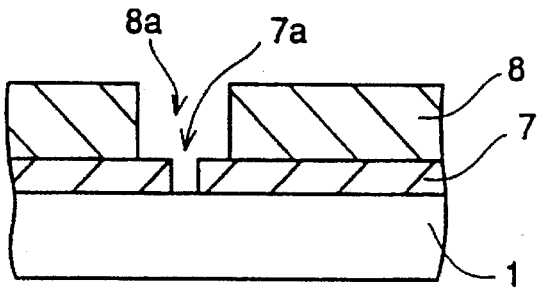
Figure 11D:
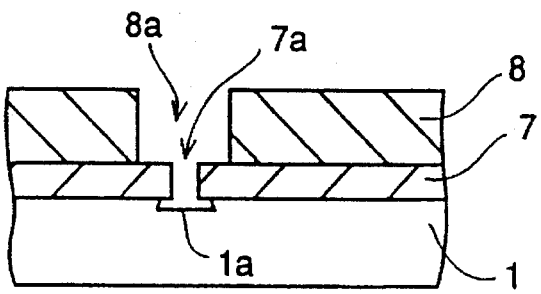
Figure 11E:
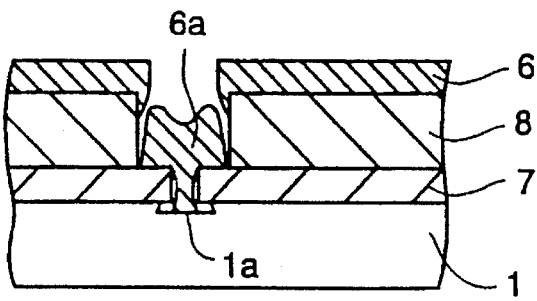
Figure 11F:
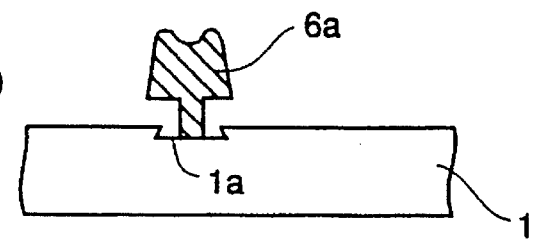

While in the above-described second and third embodiments the AlGaAs layer 17 which serves as an etching stopper in RIE using a gas mixture of SiCl$_4$ and SF$_6$ or ECR etching is formed by implanting Al ions from the surface of the n$^+$ type GaAs layer 14, the AlGaAs layer may be epitaxially grown on the n$^+$ type GaAs layer 14 as shown in FIG. 10. In FIG. 10, the AlGaAs layer 17a is epitaxially grown in an MOCVD process employing TMAl (trimethylaluminum), TMGa (trimethylgallium), and AsH$_3$ (arsine). Preferably, the growth temperature is 650° C., the pressure is 100 Torr, and the deposition rate is 200 Å/min. Since AlGaAs does not grow on the SiO$_2$ insulating film 18, selective growth of AlGaAs on the n$^+$ type GaAs layer 14 is possible.

While in the above-described first to fourth embodiments GaAs HEMTs are described, the present invention may be applied to GaAs MESFETs or InP HEMTs. In case of GaAs MESFETs, a compound semiconductor substrate of n$^+$ GaAs/AlGaAs/n-GaAs/i-GaAs is employed and selective etching of GaAs relative to against AlGaAs is carried out, similarly as in the above-described embodiments. In case of InP HEMTs, a compound semiconductor substrate of n-InGaAs/i-AlInAs/Si/i-AlInAs/i-InGaAs/i-AlInAs/i-InP is employed and selective etching of InGaAs relative to AlInAs is carried out.

What is claimed is:

1. A method for producing a field effect semiconductor device comprising:

preparing a compound semiconductor substrate having a surface;

removing a portion of said compound semiconductor substrate to form a step having a side wall transverse to the surface of said compound semiconductor substrate;

depositing a first insulating film over said compound semiconductor substrate having said step and etching said first insulating film, leaving a side wall portion of said first insulating film on the side wall of said step;

using said side wall portion of said first insulating film remaining on the side wall of the step as a mask, forming an etch blocking layer at the surface of the compound semiconductor substrate, said etch blocking layer not being etched by an etching gas;

removing said side wall portion of said first insulating film to expose a part of said compound semiconductor substrate;

using said etch blocking layer as a mask, etching the compound semiconductor substrate with the etching gas to form a recess having a depth;

depositing a second insulating film on said etch blocking layer and in the recess and etching said second insulating film, leaving side wall portions of said second insulating film at opposite side walls of the recess;

depositing a refractory metal film on said etch blocking layer, said compound semiconductor substrate in the recess, and said second insulating film;

depositing a second metal film having a lower resistance than said refractory metal film on said refractory metal film;

selectively etching said refractory metal film and said second metal film, leaving portions of said refractory and second metal films in and opposite the recess to form a gate electrode;

removing said etch blocking layer;

etching portions of said compound semiconductor substrate at opposite sides of the recess to make said portions of said compound semiconductor substrate of equal thickness;

forming a photoresist pattern on said compound semiconductor substrate and depositing an ohmic metal using said gate electrode and said photoresist pattern as a mask; and removing said photoresist pattern and overlying portions of said ohmic metal by lift-off to form spaced apart source and drain electrodes.

2. The method of claim 1 including forming said etch blocking layer by implanting ions into said compound semiconductor substrate to form an ion implanted region using said side wall portion of said first insulating film remaining on the side wall of said step of said compound semiconductor substrate as a mask, whereby said ion implanted region of said compound semiconductor substrate is converted to a composition that is not etched by the etching gas.

3. The method of claim 1 including epitaxially growing said etch blocking layer on the surface of said compound semiconductor substrate having said step using said side wall portion of said first insulating film remaining on the side wall of said step of said compound semiconductor substrate as a mask.

4. The method of claim 1 including forming the recess under etching conditions that encourage side-etching of said compound semiconductor substrate.

5. A method for producing a field effect semiconductor device comprising:

preparing a compound semiconductor substrate having a surface and a carrier concentration;

forming a semiconductor layer having a higher carrier concentration than said compound semiconductor substrate on the surface of said compound semiconductor substrate;

removing a portion of said semiconductor layer to form a step having a side wall transverse to the surface of said compound semiconductor substrate;

depositing a first insulating film over said semiconductor layer having said step and etching said first insulating film, leaving a side wall portion of said first insulating film on the side wall of said step;

using said side wall portion of said first insulating film remaining on the side wall of said step as a mask, forming an etch blocking layer at the surface of said semiconductor layer, said etch blocking layer not being etched by an etching gas;

removing said side wall portion of said first insulating film to expose a part of said compound semiconductor substrate;

using said etch blocking layer as a mask, etching said semiconductor layer with the etching gas to form a recess penetrating through said semiconductor layer, the recess dividing said semiconductor layer into a drain side portion and a source side portion thinner than said drain side portion;

depositing a second insulating film on said etch blocking layer and in the recess and etching said second insulating film, leaving side wall portions of said second insulating film at opposite side walls of the recess;

depositing a refractory metal film on said etch blocking layer, said compound semiconductor substrate exposed in the recess, and said second insulating film;

depositing a second metal film having a lower resistance than said refractory metal film on said refractory metal film;

selectively etching said refractory metal film and said second metal film, leaving portions of said refractory and second metal films in and opposite the recess to form a gate electrode;

removing said etch blocking layer;

etching said drain side portion and source side portion of said semiconductor layer to make these portions of said compound semiconductor substrate of equal thickness;

forming a photoresist pattern on said semiconductor layer and depositing an ohmic metal using said gate electrode and said photoresist pattern as a mask; and removing said photoresist pattern and overlying portions of said ohmic metal by lift-off to form spaced apart source and drain electrodes.

6. The method of claim 5 including forming said etch blocking layer by implanting ions into said semiconductor layer to form an ion implanted region using said side wall portion of said first insulating film remaining on the side wall of said step of said semiconductor layer as a mask, whereby said ion implanted region of said semiconductor layer is converted to a composition that is not etched by the etching gas.

7. The method of claim 5 including epitaxially growing said etch blocking layer on the surface of said semiconductor layer having said step using said side wall portion of said first insulating film remaining on the side wall of said step of said semiconductor layer as a mask.

8. The method of claim 5 including forming a second semiconductor layer on said compound semiconductor substrate that serves as an etch stopping layer when the recess is formed and then forming said semiconductor layer on said second semiconductor layer.

9. The method of claim 5 including:

obliquely ion milling said etch blocking layer on said drain side portion of said semiconductor layer to remove said etch blocking layer and to make the drain side portion of said semiconductor layer equal in thickness of the source side portion of said semiconductor layer;

removing said etch blocking layer from the source side portion of said semiconductor layer; and etching the drain side and source side portions of said semiconductor layer to make the drain side and source side portions of equal thickness.

10. The method of claim 5 including forming the recess under etching conditions that encourage side-etching of said semiconductor layer.

11. A method for producing a field effect semiconductor device comprising:

preparing a compound semiconductor substrate having a surface and including a semiconductor layer having a higher carrier concentration than said compound semiconductor substrate as an uppermost layer;

successively forming a first compound semiconductor film having a composition that blocks an etching gas and a second compound semiconductor film thicker than said first compound semiconductor film and having the same composition as said semiconductor layer on said compound semiconductor substrate;

removing portions of said first and second compound semiconductor films to form a side wall transverse to the surface of said compound semiconductor substrate;

depositing a first insulating film on said second compound semiconductor film, said side wall of said first and second compound semiconductor films, and said compound semiconductor substrate;

etching said first insulating film leaving a side wall portion of said first insulating film on said side wall of said first and second compound semiconductor films;

using said side wall portion of said first insulating film remaining on said side wall as a mask, forming etch blocking layers at the surfaces of said semiconductor layer and said second compound semiconductor film, said etch blocking layers not being etched by an etching gas;

removing said side wall portion of said first insulating film to expose a part of said semiconductor layer;

using said etch blocking layers as a mask, etching said second compound semiconductor film and said semiconductor layer with the etching gas to form a recess penetrating through said semiconductor layer;

depositing a second insulating film on said etch blocking layer and in the recess and etching said second insulating film, leaving side wall portions of said second insulating film at opposite side walls of the recess;

depositing a refractory metal film on said etch blocking layer, said compound semiconductor substrate exposed in the recess, and said second insulating film;

depositing a second metal film having a lower resistance than said refractory metal film on said refractory metal film;

selectively etching said refractory metal film and said second metal film, leaving portions of said refractory and second metal films in and opposite the recess to form a gate electrode;

selectively removing said etch blocking layer disposed on said second compound semiconductor film and etching said second compound semiconductor film with the etching gas;

removing said first compound semiconductor film and said etch blocking layer disposed on said semiconductor layer;

forming a photoresist pattern on said semiconductor layer at the opposite sides of the recess and depositing an ohmic metal using said gate electrode and said photoresist pattern as a mask; and removing said photoresist pattern and overlying portions of said ohmic metal by lift-off to form spaced apart source and drain electrodes.

12. The method of claim 11 including forming said etch blocking layers by implanting ions into said semiconductor layer and said second compound semiconductor film to form ion implanted regions using said side wall portion of said first insulating film remaining on the side wall as a mask, whereby the ion implanted regions of said semiconductor layer and said second compound semiconductor film are converted to compositions that are not etched by the etching gas.

13. The method of claim 11 including epitaxially growing said etch blocking layers on said semiconductor layer and on said second compound semiconductor film using said side wall portion of said first insulating film remaining on the side wall as a mask.

14. The method of claim 11 including forming a second semiconductor layer on said compound semiconductor substrate that serves as an etch stopping layer when the recess is formed and then forming said semiconductor layer on said second semiconductor layer.

15. The method of claim 11 including forming the under etching conditions that encourage side-etching of said second compound semiconductor film.

* * * * *

UNITED STATES PATENT AND TRADEMARK OFFICE
CERTIFICATE OF CORRECTION

PATENT NO.   : 5,538,910
DATED        : July 23, 1996
INVENTOR(S)  : Oku

It is certified that error appears in the above-indentified patent and that said Letters Patent is hereby corrected as shown below:

Column 18, Line 14, after "the" insert --recess--.

Signed and Sealed this

Twenty-sixth Day of November 1996

Attest:

BRUCE LEHMAN

Attesting Officer          Commissioner of Patents and Trademarks